United States Patent
Gallop et al.

[11] Patent Number: 5,869,958
[45] Date of Patent: Feb. 9, 1999

[54] METHOD OF AND APPARATUS FOR DETERMINING A RESPONSE CHARACTERISTIC

[75] Inventors: John Charles Gallop, Hampton Wick; Conway David Langham, Teddington, both of United Kingdom

[73] Assignee: The Secretary Of State For Trade And Industry, London, England

[21] Appl. No.: 776,614

[22] PCT Filed: Aug. 4, 1995

[86] PCT No.: PCT/GB95/01864

§ 371 Date: May 19, 1997

§ 102(e) Date: May 19, 1997

[87] PCT Pub. No.: WO96/04563

PCT Pub. Date: Feb. 15, 1996

[30] Foreign Application Priority Data

Aug. 4, 1994 [GB] United Kingdom .................... 9415923

[51] Int. Cl.[6] ...................................... G01R 27/02
[52] U.S. Cl. ...................... 324/71.6; 324/636; 324/618; 324/653; 324/652
[58] Field of Search ................................ 324/618, 71.6, 324/652, 653, 636

[56] References Cited

U.S. PATENT DOCUMENTS

| | | | |
|---|---|---|---|
| 3,017,571 | 1/1962 | Moricca | 324/618 |
| 3,289,074 | 11/1966 | Jones | 324/618 |
| 4,481,464 | 11/1984 | Noguchi et al. | |
| 4,959,614 | 9/1990 | Bowling | 324/71.6 |
| 4,973,912 | 11/1990 | Kaminski | 324/652 |
| 4,978,922 | 12/1990 | Mallick | 324/652 |

FOREIGN PATENT DOCUMENTS

| | | | |
|---|---|---|---|
| 0270855 | 6/1988 | European Pat. Off. | 324/652 |
| 0 496 512 A1 | 7/1992 | European Pat. Off. | |
| 0 516 145 A1 | 12/1992 | European Pat. Off. | |
| 0 522 515 | 1/1993 | European Pat. Off. | |
| WO 93/09575 | 3/1993 | WIPO | |

OTHER PUBLICATIONS

IEEE Transaction on Instrumation and Measurement, vol. 42, No. 2 Apr. 1993; Langham et al; 'Development of a High Stability Cryogenic Sapphire Dielectric Resonator'.

IEEE Transaction on Magnetics, vol. Mag–17, No. 1, Jan. 1981; Bragomsloo et a; 'The Properties of Superconducting Resonators on Sapphire'.

J. Phys. D: Appl. Phys., 15 (1982) pp. 1651–1656; Blair et al; 'High–Q Microwave Properties of a Sapphire Ring Resanator'.

Proceedings of the IEEE, vol. 74, No. 1, Jan. 1986; Bayer et al; 'Attenuation and Ratio–National Standards'.

British Museum, Nov. 15, 1972; Yell, R.W. pp. 108–110; 'Development of a High Precision Waveguide Beyond Cut–Off Attenuator'.

IEEE Transactions on Instrumentation and Measurement, vol. IM–34 (1985) Dec., No. 4, Part 1, New York, USA; Ahmad et al; 'Characterization and Modeling of Thick–Film Components For Hyrid Microwave–Integrated Circuits'.

Chance et al: "Waveforms"–Apr. 1949–McGraw Hill –p. 141.

Primary Examiner—Josie Ballato
Assistant Examiner—Jose M. Solis
Attorney, Agent, or Firm—Nixon & Vanderhye P.C.

[57] ABSTRACT

A method of determining a response characteristic of a microwave device includes coupling a microwave resonator to the device, loading the resonator with microwave radiation, monitoring the time decay of power from the resonator, and comparing the monitored time decay with a known characteristic of the time decay of radiation in the microwave resonator when loaded with radiation.

32 Claims, 6 Drawing Sheets

METHOD OF AND APPARATUS FOR DETERMINING A RESPONSE CHARACTERISTIC

BACKGROUND OF THE INVENTION

1. Field of the Invention

This invention relates generally to a method of determining a response characteristic of a microwave device, and to analogous apparatus. More particularly, the invention relates to apparatus comprising microwave resonators together with precision timing equipment and methods of using these for calibrating the amplitude response in microwave equipment and components.

2. Related Art

The requirement exists for calibrating the amplitude response of measurement equipment and components for use in the microwave region of the electromagnetic spectrum (i.e. preferably in the frequency range 1 to 300 or even 1000 GHz). In such equipment and components the output signal may be attenuated or amplified from an input signal and the ratio of output to input (the gain or attenuation) needs to be accurately known.

General methods of measuring attenuation are described by F. L. Warner in "Microwave Attenuation Measurement" (Published by Peter Peregrinus, London 1977).

Precision microwave attenuation standards are traditionally made from resistance ratios which are carefully constructed to be frequency independent. At the highest level of precision such ratios may be compared with the National Standard. A variety of methods are used for National Standards for microwave attenuation and these are reviewed by H. Bayer et al. "Attenuation and Ratio—National Standards", Proc. IEEE 42, page 46, 1986. The UK primary standard is currently based on a waveguide beyond cut-off calibrator (See: R. W. Yell, "Development of a High Precision Waveguide Beyond Cut-off Attenuator", CPEM Digest 1972 pp 108–110). In such standards, the microwave frequency is often down-converted in a linear mixer to a lower intermediate frequency (IF) and measurements made at the IF with high precision mechanical apparatus. Such apparatus is capable of calibration to high resolution, for example to 0.0002 dB in 100 dB, with an accuracy of 0.01 dB in 10 dB, but is complex and costly to construct. A common feature of known calibration techniques is that they calibrate the steady-state response of the device under test.

The invention described herein preferably uses high Q microwave resonators, where Q is defined by:

$$Q_1 = f_O / \Delta f$$

Where $Q_1$ is the loaded Q of the resonator, $f_O$ is the resonant frequency of the resonator and $\Delta f$ is the bandwidth of the resonance at the half power (3dB) points. 'High' Q in the context of this invention is $Q > 10^4$, $10^5$ or $10_6$. As of 1995, Q's as high as $10_{11}$ are achievable practically. Typical resonators known in the art include dielectric resonators (See: D. G. Blair et al. "High Q Microwave Properties of a Sapphire Ring Resonator", J. Phys. D: Applied Physics, Volume 15, Page 1651, 1982) and superconducting resonators (See: V. B Braginskii et al. "The Properties of Superconducting Resonators on Sapphire", IEEE Trans. on Magn. Volume 17, Page 955, 1981, and C. D. langham and J. C. Gallop, "High Stability Cryogenic Sapphire Dielectric Resonator", IEEE Trans. Instrum. and Meas., 42, Page 96, 1993).

Superconducting resonators fabricated from low temperature superconducting (LTSC) materials can demonstrate Q in the range $10_6$ to $10_{11}$ but such devices must operate at a low temperature, typically less than 4.2K (−269° C.), using liquid Helium as coolant.

Development of high temperature superconducting (HTSC) oxide materials has allowed fabrication of high Q resonators ($Q > 10^6$) from these materials which can operate at 77K (−196° C.) using liquid Nitrogen coolant. Different designs of resonator are known (See: S. J Fiedziusko et al. European Patent Application (EPA) 0496512A1, K. Higaki et al EPA 0522515A1 and EPA 0516145, and Z-Y Shen, PCT Application PCT/US92/09635) using different arrangements to make best use of HTSC materials properties.

SUMMARY OF THE INVENTION

It is an aim of the present invention to overcome the problems encountered with the prior art, and more particularly to use the known decay of radiation in a high Q microwave resonator together with precision timing apparatus to measure the amplitude response of microwave equipment or components under test.

According to the present invention, there is provided a method of determining a response characteristic of a microwave device comprising coupling a microwave resonator to the device, loading the resonator with microwave radiation, monitoring the time decay of power from the resonator, and determining the response characteristic of the device in dependence on the monitored time decay.

As used herein, the term "microwave device" connotes broadly any type of microwave equipment or component, such as microwave spectrum analysers, microwave amplifiers, microwave signal generators, or more simple components such as resistors and the like. The response characteristic of a resistor would typically be the voltage drop across the resistor.

The resonator may be coupled to the device either before or after being loaded with microwave radiation. If before, then both the resonator and the device would be loaded with radiation prior to the monitoring step. It will be appreciated that this would not usually affect the test in question, since the capacity of the device under test to store microwave energy would invariably be negligible.

It will be understood from the foregoing that the present invention preferably provides a method of measuring or calibrating the amplitude response of microwave equipment or components utilising accurate timing means to monitor the time decay of power in a microwave resonator loaded or filled with microwave radiation when such radiation has passed through the equipment or component under test and comparing the observed time decay with the known time decay of radiation in a microwave resonator loaded with radiation.

The present invention also preferably provides a method of calibrating a response characteristic of a microwave device comprising providing a microwave resonator coupled to the device, filling the resonator with microwave radiation, monitoring the time decay of power from the resonator in the device or as indicated in the device, and comparing the monitored time decay with the known time decay of radiation in the microwave resonator, when filled with radiation but in the absence of the device.

A basic feature underlying the preferred embodiments of the invention is to use the known characteristic of the radiation in a microwave cavity, that the radiation decays exponentially, to plot deviations from ideal of amplitude response in test equipment. This is done by comparing the time decay of the radiation having passed through the test equipment with the accurately known exponential decay of radiation in a bare resonator. Hence, power, which is a difficult quantity to measure directly, is effectively evaluated in terms of time, which is a considerably easier quantity to measure.

The decay of the radiation is advantageously sufficiently long for timing to sufficient accuracy to be made. As timers are available which can measure with an accuracy in the nanosecond regime, this implies use of a high Q resonator.

Preferably, the resonator is fabricated from superconducting material and operated at a temperature below the superconducting transition temperature.

Preferably, the superconducting material has a transition temperature above 30 or 60K, more preferably above 70 or even 80K.

Preferably, the resonator is held at a temperature below the superconducting transition temperature using a closed cycle refrigerator.

Preferably, the resonator comprises dielectric material. As used herein, the term "comprises" connotes, inter alia, "includes" or "contains".

Preferably, a microwave source is provided for loading the resonator with microwave radiation. Alternatively (or additionally), an amplifier may be provided, coupled to the resonator, to amplify power in the resonator. The former case, using an "external" microwave source, can be relatively simple but relative expensive to implement in practice. The latter case, which may operate on the loop oscillator principle, can effectively utilise the resonator itself as the microwave source. This can be relatively cheap but relatively complicated to implement.

The present invention extends to apparatus for determining a response characteristic of a microwave device, comprising a microwave resonator, means for coupling the resonator to the device, means for loading the resonator with microwave radiation, means for monitoring the time decay of power from the resonator, and means for determining the response characteristic of the device in dependence on the monitored time decay.

Apparatus features analogous to the aforementioned method features are also provided.

Hence, preferably, the resonator comprises superconducting material and the apparatus is adapted to operate the resonator at a temperature below the superconducting transition temperature.

Preferably, the superconducting material has a transition temperature above 60K.

Preferably, the apparatus further comprises a closed cycle refrigerator for holding the resonator at a temperature below the superconducting transition temperature.

Preferably, the resonator comprises dielectric material.

Preferably, the apparatus includes a microwave source for loading the resonator with microwave radiation.

Preferably, the apparatus includes an amplifier, coupled to the resonator, for amplifying power in the resonator.

With the present invention, preferably a resonator is first loaded up with microwave electromagnetic energy (Frequency range 1 to 300 GHz) until a steady state is reached where the input power is equal to the sum of the power dissipated in and that radiated from the resonator. The output port of the resonator is connected to the attenuator, amplifier or other device to be calibrated. When a steady state is achieved for power in the resonator an accurate trigger and clock generator opens a fast switch, cutting off the input power to the resonator. As a result the stored energy $U(t)$ and the radiated power $P(t)$ both decay in an accurately exponential manner with time:

$$P(t) \propto U(t) = U(O)\exp(-2\pi\Delta ft) \qquad \text{Equation 1}$$

where $\Delta f$ is the 3dB linewidth of the resonance at frequency $f_0$ and is related to the loaded $Q_1$ by the expression:

$$Q_1 = f_O/\Delta f$$

The higher the Q the greater the accuracy of the microwave power scale $P(t)$ since, provided signal-to-noise considerations do not limit performance, it is the timing accuracy $\delta t$ of the instant t at which a calibration is made which sets the limiting resolution $\delta P$ of the device. Thus:

$$\delta P \propto U(O) \exp(-2\pi\Delta ft)\delta t/2\pi\Delta f$$

Operation in the time domain is preferable to operation in the frequency domain because time intervals can be readily measured to high precision. Thus use of a high Q resonator, together with a precision timer, gives a device which can generate microwave output power whose amplitude decays as an accurately exponential function with time. Amplitude ratios, and hence attenuation or amplification ratios can then be derived from timing interval ratios.

In practice, the power decay from the isolated resonator can be measured in the piece of equipment under test as a function of time, using the external accurate timing circuit as a reference. Deviations from the exponential decay of resonator output power amplitude will then indicate non-linearities in amplitude response or attenuation ratio in the equipment or component under test.

It will be understood from the foregoing that one known characteristic of the time decay of radiation in a microwave resonator, known without any experimental determination but purely from theoretical considerations, is that the decay is exponential. Comparison of the monitored time decay with an exponential form can indicate non-linearities in the response characteristics of the device under test.

Another known characteristic could be the time constant of the exponential decay. This would usually need to be measured experimentally. Comparison of the monitored time decay with this time constant can yield information concerning the gain or attenuation of the device in question.

In a prototype apparatus, using a cavity resonator fabricated from lead containing sapphire dielectric, operating at 4.2K (−269° C.) a Q in excess of $10^7$ can be achieved. In such a resonator, microwave power amplitude output, if operated as described above, decays in a timescale of 1 to 10 milliseconds. Timing accuracy can be achieved over such a period such that attenuation ratios of the order 0.01 dB can be resolved, say, in a 10, 20 or 30 dB range. This is adequate for calibrating apparatus or devices and has the advantage of being a direct measurement at the resonator frequency, without requiring down-conversion or precision mechanical apparatus.

Whilst the prototype apparatus uses low temperature superconductor (LTSC) material, it is known that high Q resonators can be fabricated of high temperature superconductor (HTSC) oxide material. Such resonators can demonstrate Q in excess of $10^7$ below the superconducting transition temperature of the material (90K or −183° C.) and can operate in liquid Nitrogen coolant (Boiling point 77K or −196° C.).

Fiedziusko et al. (European Patent Application 0496512A1) have shown that such a resonator can be made sufficiently small that operation is possible with a closed cycle cooler (for example a Stirling cycle cooler capable of cooling to 60K or −213° C.) such as are commercially available. Use of such a cooler has the practical advantage that no liquid cryogen is then necessary to cool the resonator to below the transition temperature of the superconductor, giving a HTSC resonator having sufficiently high Q to be used in this invention.

BRIEF DESCRIPTION OF THE DRAWINGS

Preferred features of the present invention are now described by way of example with reference to the accompanying drawings, in which.

DETAILED DESCRIPTION OF EXEMPLARY EMBODIMENTS

Figure 1:
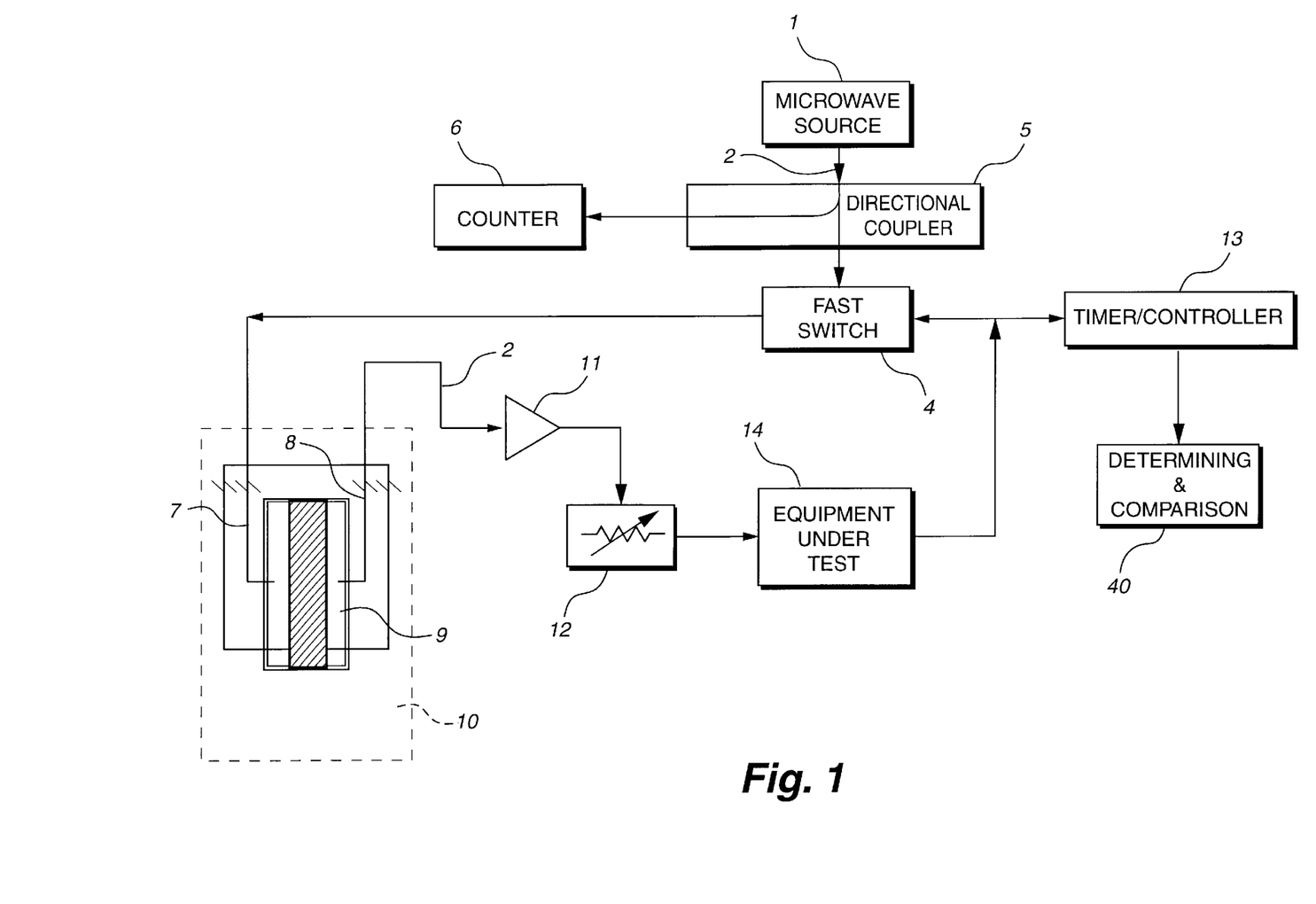
FIG. 1 is a schematic block diagram of one embodiment of this invention arranged to measure the response of an attenuator, amplifier or detector in a piece of equipment under test using an external microwave source to load the resonator.

A first preferred embodiment of the invention is illustrated in FIG. 1 where a resonator 9 is arranged inside a cooled enclosure 10. Examples of resonators which may be used include cavity dielectric loaded resonators, stripline resonators and coaxial resonators. Coaxial resonators may be used where measurements at a number of frequencies may be needed because such resonators may be tuned to a number of resonant modes having equally spaced frequencies. The resonators may be formed from low temperature superconductor LTSC) material or high temperature superconductor (HSC) material, with or without dielectric loading, but would preferentially be formed of dielectric material in a HTSC enclosure. The cooled enclosure 10 may be a cryostat or refrigerator capable of operation below the transition temperature of the material from which resonator 9 is fabricated.

A stable microwave source 1 is connected by a conductor, waveguide or similar means 2 to the input of directional coupler 5. Examples of microwave source 1 could include signal generators and microwave oscillators. The first output of directional coupler 5 is connected to fast switch 4. Fast switch 4 may, for example, be a PIN diode switch, but any switch capable of switching in less than the decay time for microwave radiation in resonator 9 may be used. Fast switch 4 operates under the control of timer/controller 13. The output of fast switch 4 passes to the input 7 of resonator 9. The second output of directional coupler 5 is connected to a counter 6.

The output 8 of the resonator 9 is connected via a conductor, waveguide or similar means 2, via an optional low noise amplifier 11 and an optional variable attenuator 12, to the input of equipment under test 14. Timer/controller 13 also provides accurate timing reference signals to the equipment under test 14.

It will be appreciated that the lines shown in FIG. 1 from the timer/controller 13 to the fast switch 4 and the equipment under test 14 signify paths for communicating control and like signals.

Examples of equipment under test 14 would include microwave spectrum analysers, microwave amplifiers, microwave signal generators and similar equipment. Such equipment usually provides an output proportional to the input, the proportionality being set by the internal attenuator or amplifier gain setting. The proportionality relationship between input and output in such equipment may be calibrated by the present invention.

Finally, the results of the calibration test are passed from the output of the equipment 14, via the timer/controller 13, to a determining and comparison means 40, for comparison with the known time decay of radiation in the resonator 9. The determining and comparison means would typically comprise a suitably programmed digital computer. If, as would perhaps be particularly common, it were desired to determine the non-linearities in the gain or attenuation of the device under test by comparison with the theoretically known exponential decay characteristic of the microwave resonator, this could be achieved by programming the computer to determine the logarithm of the monitored time decay, evaluate a linear least squares fit, and evaluate from the departure from the exponential behaviour the non-linearities of the device (hence effecting a comparison with the truly exponential behaviour of the resonator itself). Such an evaluation would yield information concerning the variation of gain (or amplitude response) at different power levels.

In operation, the resonator 9 is held at a temperature below the critical temperature of the resonator material by cooled enclosure 10. Fast switch 4 is held closed under the control of timer/controller 13. The stable microwave source 1 generates power which passes via directional coupler 5 and fast switch 4 to the input 7 of the resonator 9. The frequency of microwave source 1 is monitored by counter 6 connected to the second output of directional coupler 5. Energy stored in the resonator 9 increases until power into the resonator via 7 is matched by power loss in the resonator and power dissipated through the resonator output 8. Power from output 8 passes to an amplifier 11 and then, via attenuator 12, to the equipment under test 14.

Low noise amplifier 11 and attenuator 12 are optional and may be omitted.

When a steady state of power in resonator 9 is achieved, fast switch 4 is opened under the control of timer/controller 13. The decay of microwave power in resonator 9, passing via amplifier 11 and attenuator 12 to the equipment under test 14 is accurately timed by the timer/controller 13. Deviations from the known exponential decay in power in resonator 9 appearing at the output of the equipment. under test 14 then indicate departure from linearity in the amplitude response of 14.

It will be understood that, as explained above, dependent upon the specific type of calibration to be performed, the actual time constant of the known exponential decay in power in the resonator need not be determined experimentally, although it could be if desired; usually it suffices to know that the decay in power is exponential in form.

If amplifier 11 and attenuator 12 are included, a correction for any known non-linearity of these components may be applied.

Figure 4:
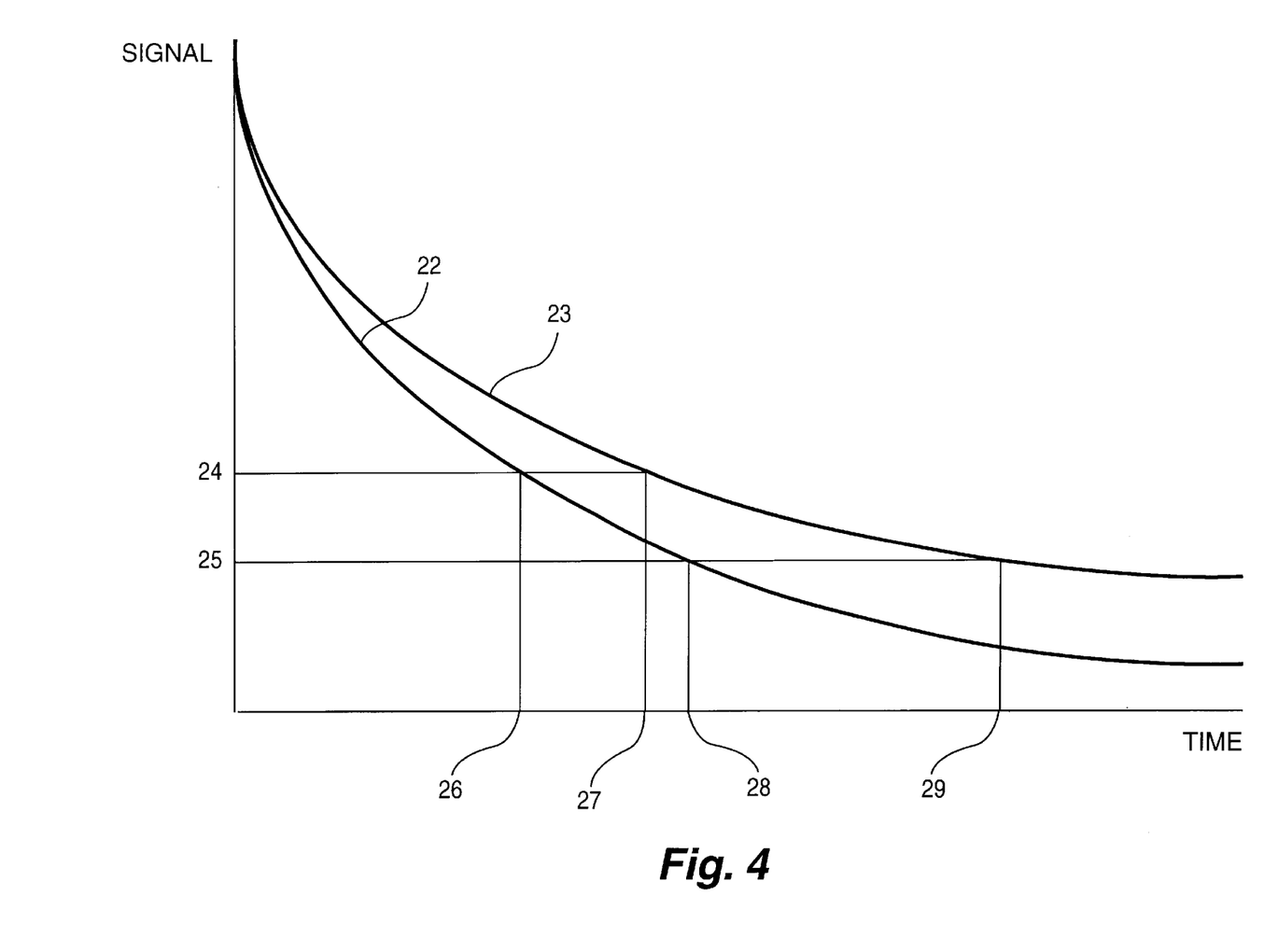
FIG. 4 is a graph representing the signal decay with time from the isolated resonator, and the decay observed in the equipment or component under test.

FIG. 4 shows a representation of the signal decay with time. The upper curve 23 represents the signal decay in the resonator after the fast switch is opened and is known to accurately follow an exponential decay as defined in Equation 1. The time for the signal to pass from one predetermined level 24 to another 25 is measured by the time interval 27 to 29. The lower curve 22 represents the signal decay with time in the equipment under test, although in practice this curve would have a more complex form than that shown. The time to pass from level 24 to level 25 in the equipment under test is represented by the interval 26 to 28. The time interval 27 to 29, which represents a known change in signal level can then be compared with the interval 26 to 28 to derive the departure from theoretical of the amplitude response of the equipment under test.

It will be understood that the time constants of the two curves shown in FIG. 4 would be virtually identical. Differences between the two curves represent the non-linearities of the device under test. Such non-linearities would not usually be expected to exceed 10% or so.

Whilst only two signal levels are shown in FIG. 4, in practice a plurality of signal levels would be chosen and timing intervals between these for the equipment under test would be compared with the known decay times for the resonator to give attenuation or amplification ratios over a range of values.

It will be appreciated that the measurements described above are made at a single frequency set by the high Q resonator 9. If a multi-mode resonator, such as a coaxial resonator is chosen, then the operating frequency of the microwave source 1 can be adjusted to be at another resonant mode of the resonator, so that resonator 9 fills with radiation at a second frequency, monitored by counter 6. Timing measurements as described above can be repeated at this second frequency and subsequent frequencies at which the resonator has resonant modes. Alternatively, to operate at different frequencies, resonator 9 may be tuned to operate at a different frequency or changed for another resonator which resonates at a different frequency.

Figure 2:
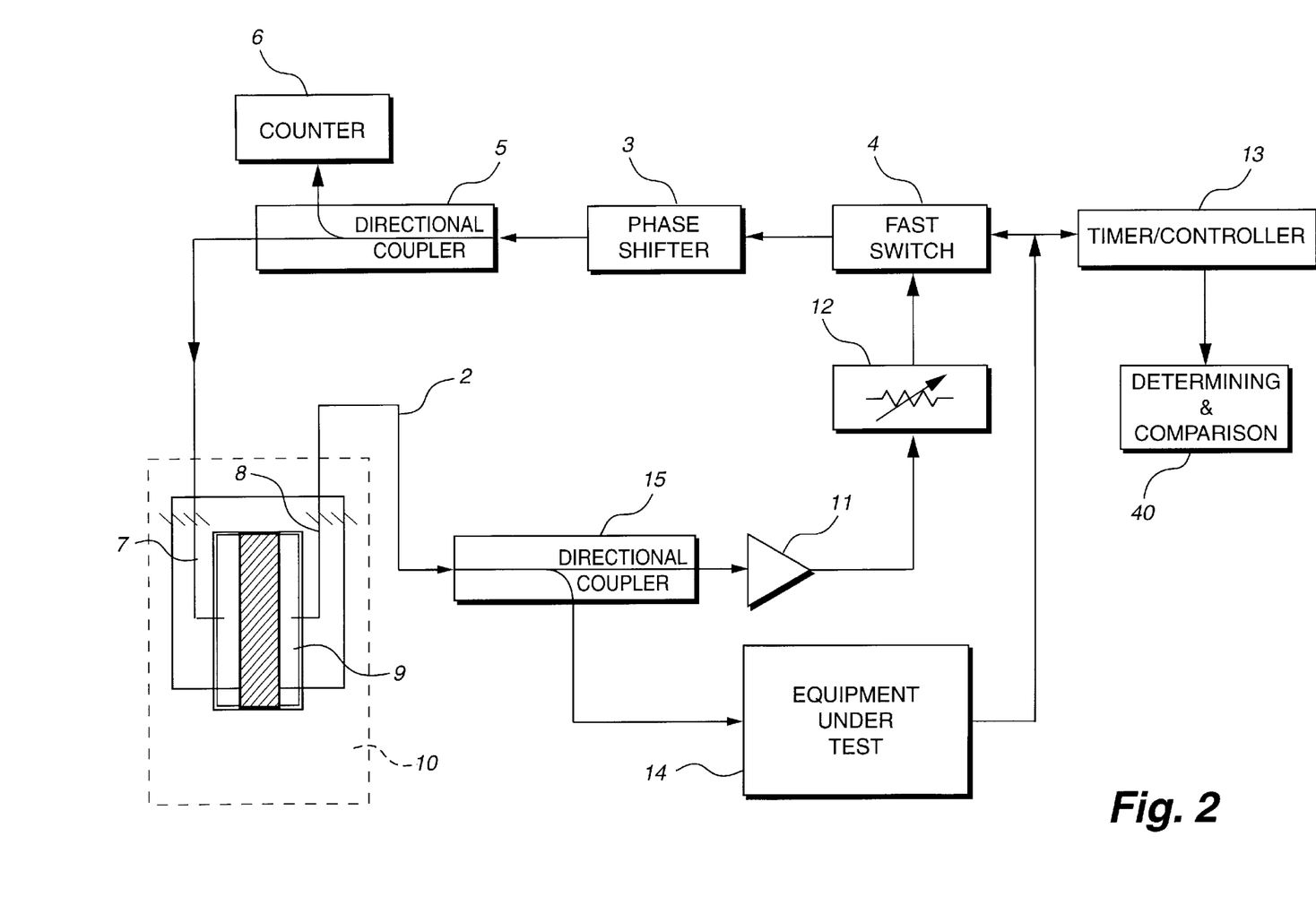
FIG. 2 is a schematic block diagram of another embodiment of this invention arranged to measure the response of an attenuator, amplifier or detector in a piece of equipment under test using a loop oscillator configuration.

FIG. 2 illustrates an alternative embodiment, where the resonator is connected as a loop oscillator. In this arrangement, the resonator 9 is held at a temperature below the critical temperature of the material from which 9 is fabricated by cooled enclosure 10. The resonator output 8 is connected through a conductor, waveguide or similar means 2 to first directional coupler 15. One output of first directional coupler 15 is connected to amplifier 11 whilst the second output of first directional coupler 15 is connected to the equipment under test 14. The output of amplifier 11 is connected via attenuator 12 to the fast switch 4, which operates under the control of the timer/controller 13. Timer/controller 13 also supplies accurate timing reference signals to the equipment under test 14. The output of switch 4 passes through phase shifter 3, to a second directional coupler 5, the output of which is connected to the input 7 of resonator 9. The second output of second directional coupler 5 is connected to counter 6.

In this configuration, thermal excitation within resonator 9 at its resonant frequency is amplified in amplifier 11. Suitable adjustment of attenuator 12 and phase shifter 3 can make oscillation of resonator 9 self sustaining at one of its resonant modes, so power inside resonator 9 builds to a steady level, at a frequency monitored by counter 6.

The advantage of this configuration is that a stable microwave source is not needed. Amplifier 11 can be fixed gain and its bandwidth is not critical because the self excitation of high Q resonator 9 generates the required narrow frequency band.

Alternatively, amplifier 11 could incorporate a band-pass filter centered on the resonant frequency of the selected oscillation mode.

As described above, power in the resonator 9 is allowed to build to a steady level. Fast switch 4 is opened under control of timer/controller 13, which also accurately times decay of the power from resonator 9 through the equipment under test 14.

As also described above, and illustrated in FIG. 4, the timing ratios of periods for the signal to pass between predetermined levels, as measured in equipment under test 14, can be compared with the known decay of power in the resonator 9 to give measurement of deviations in amplitude response in the equipment under test 14.

If operation of the loop oscillator configuration in FIG. 2 is required at different frequencies then a multi-mode resonator, such as a coaxial resonator, may be chosen for resonator 9. Amplifier 11 and attenuator 12 must then be selected to have adequate gain over all of the resonant mode frequencies of resonator 9. As the loop oscillator configuration is self exciting using thermal oscillations in the resonator 9, mode selection is achieved by adjustment of phase shifter 3 to give a phase shift of an integral of $2\pi$ at the resonator input 7, relative to its output 8 at the selected resonant frequency of resonator 9. The new operating frequency of the loop oscillator is monitored by counter 6.

Figure 3:
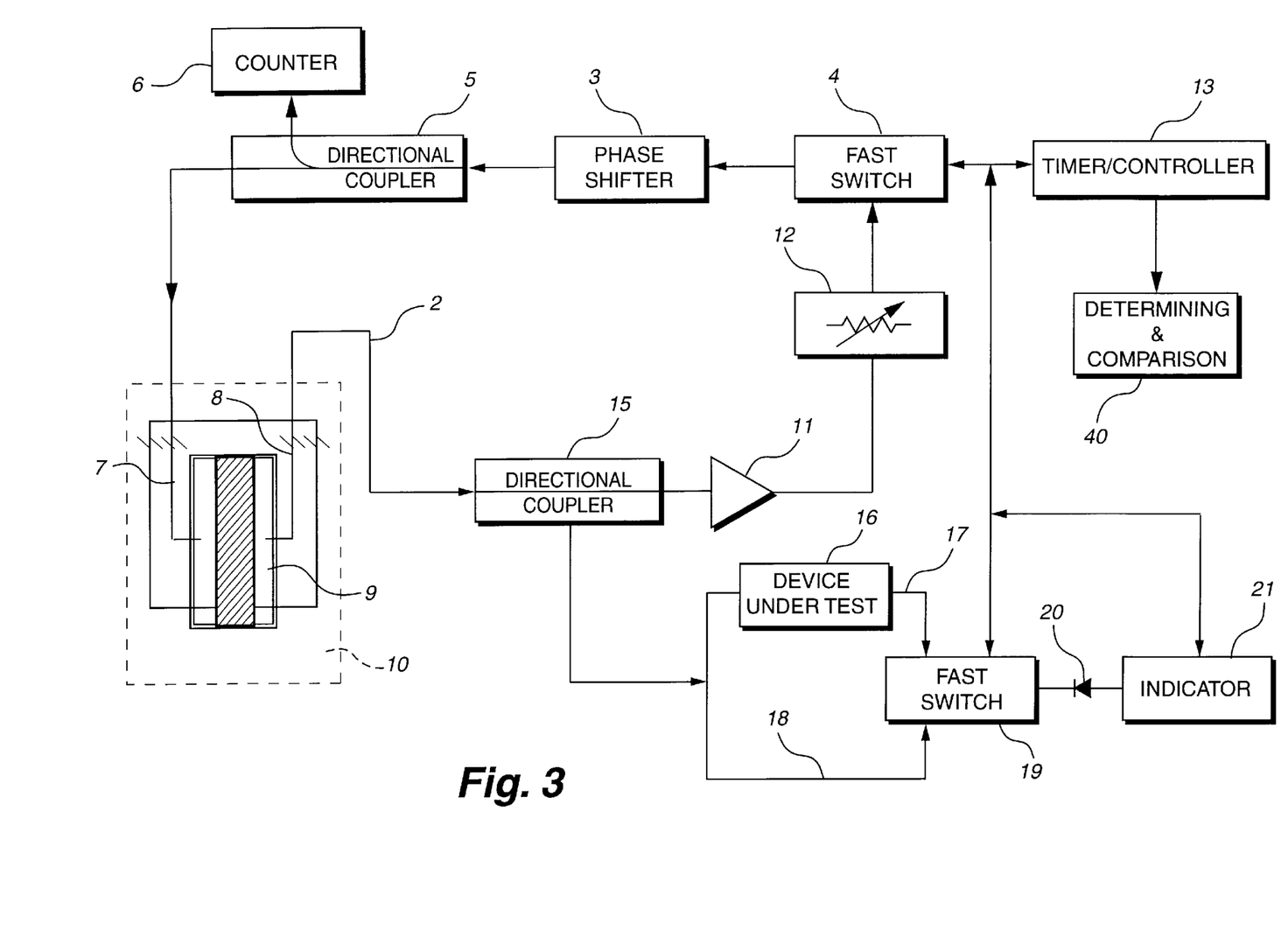
FIG. 3 is a schematic block diagram of a further embodiment of this invention arranged to measure the response of a component under test using a loop oscillator configuration.

FIG. 3 represents another embodiment, using a loop oscillator configuration to measure the amplitude response of components under test, or to compare components under test. As noted above, microwave equipment usually has an output which is proportional to the input. When testing components, however, some means is preferably included to quantify the signal emerging from the component under test.

In the embodiment illustrated in FIG. 3, the resonator 9 is held at a temperature below the critical temperature of the material from which the resonator is constructed by cooled enclosure 10. The output 8 of resonator 9 is connected by a conductor, waveguide or similar means 2 to first directional coupler 15. The first output of first directional coupler 15 is connected to amplifier 11, which in turn is connected via attenuator 12 to first fast switch 4 which operates under the control of timer/controller 13. The output of first fast switch 4 connects via phase shifter 3 to second directional coupler 5, the first output of which is connected to the input 7 of resonator 9 whilst the second output of second directional coupler 5 is connected to counter 6.

As described above, with first fast switch 4 being held closed by timer controller 13, the loop formed by components 9, 15, 11, 12, 4, 3 and 5 forms a loop oscillator, where thermal oscillations in resonator 9 are amplified and fed back so that microwave power at the resonant frequency of resonator 9 builds inside the resonator to a steady level.

The second output of first directional coupler 15 is connected to the input of the component under test 16 and to the second input 18 of second fast switch 19. The output of component under test 16 is connected to the first input 17 of second fast switch 19. In practice, the connection between the second output of directional coupler 15 and the second input 18 of second fast switch 19 would be chosen to be equal in length to the connection from second output of directional coupler 15 through the component under test 16 to first input 17 of second fast switch 19.

Second fast switch 19 operates as a change-over switch, so that either the first input 17 or the second input 18 may be connected to the switch output under the control of timer/controller 13. The output of second fast switch 19 passes through diode 20 to fast indicator 21. Indicator 21 may be a fast analogue to digital converter (ADC) or similar means for recording the output from fast switch 19. The output may, for example, be recorded as a d.c. voltage signal. Indicator 21 also operates under the control of timer/controller 13 which also supplies accurate timing reference signals.

In operation, first fast switch 4 is held closed by timer/controller 13. Thermal oscillations in resonator 9 are amplified and fed back into input 7 to form a self exciting oscillator at the resonant frequency of resonator 9, so that power in resonator 9 builds to a steady value at a frequency monitored by counter 6. Timer/controller 13 then connects the first input 17 of second fast switch 19 to the output of second fast switch 19, which connects via diode 20 to indicator 21 and the steady reading on indicator 21 is recorded. This steady reading on indicator 21 represents the signal level which has passed through device under test 16. The timer/controller 13 then opens first fast switch 4, whilst switching the second input 18 of second fast switch 19 into connection with the output. Power in resonator 9 then passes through output 8 to first directional coupler 15 and then from the second output of first directional coupler 15 to the second input 18 of second fast switch 19 where it passes to the output of second fast switch 19. The output of second fast switch 19 passes through diode 20 and the output of 20 is recorded by indicator 21. Accurate timing signals are passed from timer/controller 13 to indicator 21. In this way the decay in time of power in resonator 9 is recorded in indicator 21.

As described above, with reference to FIG. 4, timing intervals between two or more preselected signal levels can be used to compare the amplitude response of the component under test with the known signal decay in the resonator. In the apparatus in FIG. 3, as described above, the decay in time is observed without the component under test in the circuit and the time delay recorded for the signal level to decay to the steady state signal level present at 21 when connected to the device under test 16. In this way a single decay measurement can determine the attenuation in the device under test 16 once the decay characteristic of the resonator has been determined. A similar arrangement may be used if component under test 16 is an active rather than passive component, in which case the component gain can be measured.

An alternative arrangement might use measurement of two decay responses with time, using the well known series or parallel substitution methods to compare components.

The technique for determining the amplitude response of the component using the determining and comparison means 40 is now described. Firstly, the exponential decay characteristic of the resonator is determined, in the absence of the component under test. From this decay characteristic is known the rate of decay of power in the resonator in dB's per second. This information is passed to the comparison means 40.

Secondly, the determining and comparison means converts the time delay observed without the component under test in the circuit to decay to the steady state signal level present when connected to the device under test, into a power value using the known rate of decay of power in the resonator.

It will be appreciated that the comparison which is effected is between the monitored time decay and a predetermined rate of time decay for the resonator itself.

If measurements on components under test are required at different frequencies then a multi-mode resonator, such as a coaxial resonator, may be chosen for resonator 9. Amplifier 11 must then be selected to have adequate gain over all of the resonant mode frequencies of resonator 9. As the loop oscillator configuration is self exciting using thermal oscillations in the resonator 9, mode selection is achieved by adjustment of phase shifter 3 to give a phase shift of an integral of $2\pi$ at the resonator input 7, relative to its output 8 at the selected resonant frequency of resonator 9. Timing measurements as described above can be repeated at the second and subsequent frequencies.

In the apparatus as described with reference to FIG. 3, it will be understood that the means for quantifying the signal emerging from the component under test comprises the fast switch 19, the diode 20, and the indicator 21.

Figure 5:
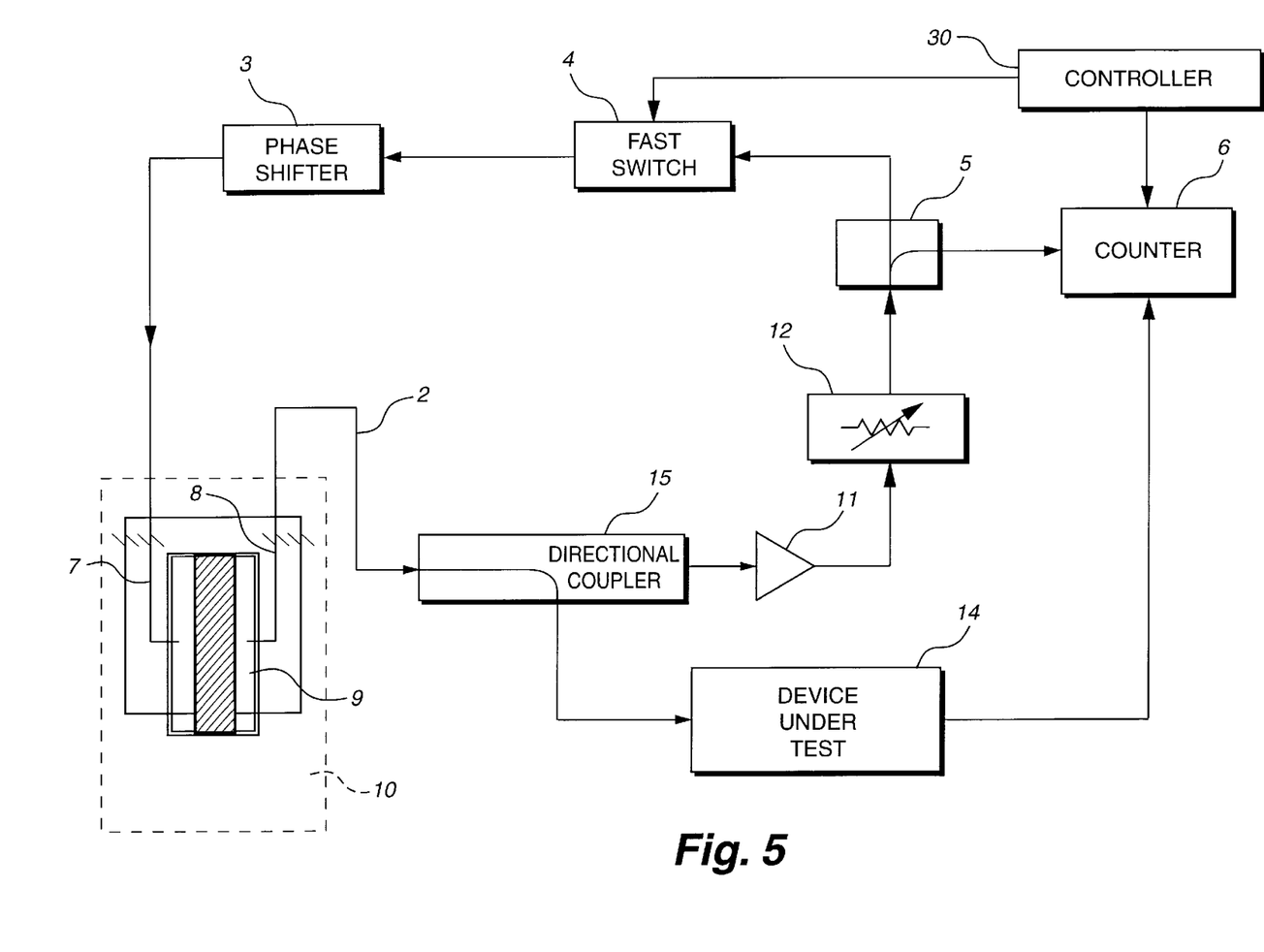
FIG. 5 is a schematic block diagram of a further embodiment of this invention arranged to measure the response of an attenuator, amplifier or detector in a piece of equipment under test using a loop oscillator configuration where the timing means has been replaced by a counter counting oscillation cycles in the radiation decaying in the resonator.

A further embodiment of the invention is shown in FIG. 5. This embodiment differs from those previously described in that no external precision timer is required. This is possible because the high Q of the resonator implies a very narrow bandwidth for the radiation in the resonator at its resonant frequency. As the preferred form of the resonator is a dielectric loaded superconducting resonator operating at a temperature below the critical temperature of the superconductor, such a resonator can form a very stable oscillator having a narrow bandwidth. Accordingly, instead of using external timing means, oscillation cycles of radiation in the resonator can be counted, in a suitable counter, to form the timebase for the radiation decay. As the resonant frequency of the resonator is chosen to be >1 GHz, then each cycle of oscillation of radiation in the resonator lasts <1 nanosecond.

As shown in FIG. 5, the apparatus is again configured in a loop oscillator arrangement. In this arrangement, the resonator 9 is held at a temperature below the critical temperature of the material from which resonator 9 is fabricated by cooled enclosure 10. The resonator output 8 is connected through a conductor, waveguide or similar means 2 to first directional coupler 15. One output of first directional coupler 15 is connected to amplifier 11 whilst the second output of first directional coupler 15 is connected to the equipment under test 14. The output of amplifier 11 is connected via attenuator 12, through second directional coupler 5, to the fast switch 4, which operates under the control of the controller 30. The second output of second directional coupler 5 is connected to counter 6. Controller 30 also supplies control signals to counter 6 and to the equipment under test 14. The output of switch 4 passes through phase shifter 3 to the input 7 of resonator 9. In this configuration, amplifier 11 does not require high linearity because only the number of oscillation cycles are to be counted.

As described above, fast switch 4 is held closed under the control of controller 30 and thermal excitation within resonator 9 at its resonant frequency is amplified in amplifier 11. Suitable adjustment of attenuator 12 and phase shifter 3 can make oscillation of resonator 9 self sustaining at one of its resonant modes, so power inside resonator 9 builds to a steady level.

When power in the resonator has built to a steady level, controller 30 opens fast switch 4 and simultaneously resets counter 6 which begins to count oscillation cycles in the resonator. The cumulative count in counter 6 is used as the timebase to measure the signal decay recorded in the equipment under test 14.

Figure 6:
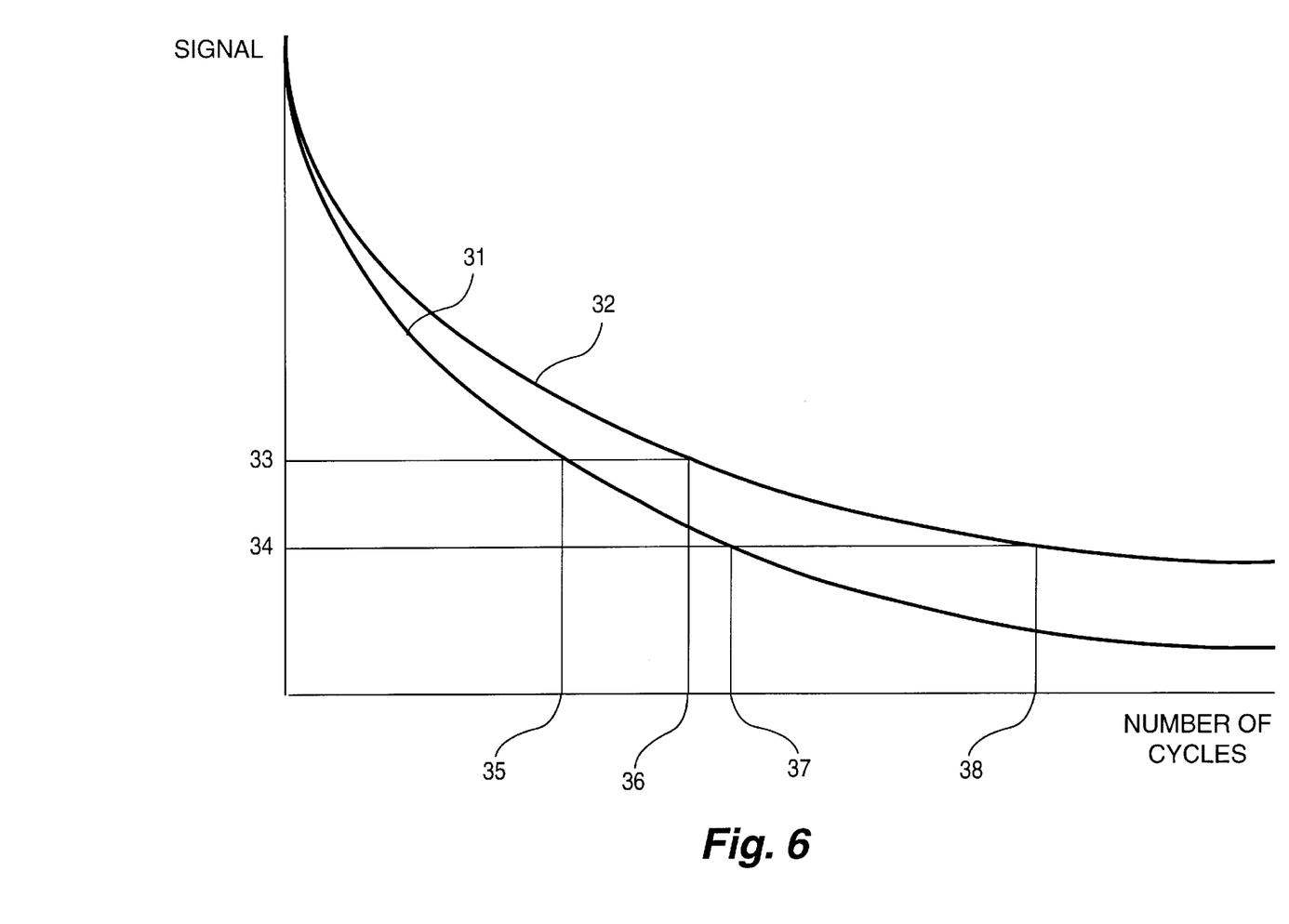
FIG. 6 is a graph representing the signal decay as a function of the number of oscillation cycles of the radiation decaying in the isolated resonator, and the decay observed in the equipment or component under test.

FIG. 6 shows a representation of the signal decay against accumulated oscillation cycles as measured by the counter 6 in FIG. 5. The upper curve 32 represents the signal decay in the resonator after the fast switch is opened and is known to accurately follow an exponential decay as defined in Equation 1. The interval for the signal to pass from one predetermined level 33 to another 34 is measured by the number of oscillation cycles between 36 and 38. The lower curve 31 represents the signal decay in the equipment under test against accumulated oscillation cycles measured by the counter, although in practice this curve would have a more complex form than that shown. The interval to pass from level 33 to level 34 in the equipment under test is represented by the count range 35 to 37. The number of oscillation cycles in the interval 36 to 38 which represents a known change in signal level can then be compared with the number of oscillation cycles in interval 35 to 37 to derive the departure from theoretical of the amplitude response of the equipment under test.

Whilst the number of oscillation cycles may be measured from the time that fast switch 4 in FIG. 5 is opened and the count difference between points 36 and 38 and 35 and 37 are taken, an alternative would be to use preset signal level 33 to start the count and signal level 34 to stop the count in the measurement of signal decay. This might be readily achieved using signal comparator circuits, or similar means (such as signal amplitude circuits, based on a detector diode and a voltage comparator circuit, which produce an output signal when the input voltage falls within a predetermined range) set to levels 33 and 34 in FIG. 6 which would then generate signals to start and stop the counter. Multiple comparators may be used if measurements are needed at a number of signal levels or, alternatively, the form of the whole decay curves 31 and 32 in FIG. 6 may be plotted against cumulative count.

It will be appreciated, in the light of the disclosures above, that apparatus as described in FIG. 3 for the testing of components may be configured in a form similar to that described in FIG. 5 so that oscillations of radiation in the resonator may be counted in a counter as an alternative to using a precision timer. Similarly, measurements using apparatus described in FIG. 5 may be made at a multiplicity of frequencies using different resonant modes of the resonator as described above.

In the preferred embodiments, all of the components of the relevant embodiment, including the cooling means for the cooled enclosure 10, are housed within a single housing. In order to achieve this, the cooling means needs to be of a practicable size, and hence would usually be a closed cycle cooler.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. A method of determining a response characteristic of a microwave device, said method comprising the steps of:
   coupling a microwave resonator to said device,
   supplying said resonator with microwave electromagnetic energy until a steady state condition is reached in which input power equals the power dissipated in and radiated from said resonator;
   cutting off the supply of microwave electromagnetic energy to said resonator;
   monitoring the time decay of radiated power from said resonator; and
   determining the response characteristic of said device in dependence on said monitored time decay.

2. A method as in claim 1 wherein said determining step comprises the step of comparing the monitored time decay with a known characteristic of said time decay of radiation in said microwave resonator when supplied with radiation.

3. A method as in claim 1 wherein said resonator is fabricated from superconducting material and operated a temperature below the superconducting transition temperature.

4. A method as in claim 3 wherein said superconducting material has a transition temperature above 60K.

5. A method as in claim 3 wherein said resonator is held at a temperature below the superconducting transition temperature using a closed cycle refrigerator.

6. A method as in claim 4 wherein said resonator is held at a temperature below the superconducting transition temperature using a closed cycle refrigerator.

7. A method as in claim 1 wherein said resonator comprises dielectric material.

8. A method as in claim 1 wherein a microwave source is provided for supplying said resonator with microwave radiation.

9. A method as in claim 1 wherein an amplifier is provided, coupled to said resonator, to amplify power in said resonator.

10. Apparatus for accurately determining a response characteristic of a microwave device, said apparatus comprising:
    a microwave resonator adapted for connection to said device;
    a switch connected to cause controlled cessation of energy input to said resonator without disconnection of said device from the resonator; and
    a time decay measurement circuit connected to monitor the decay of microwave energy passing from the resonator to the device after said cessation of energy input occurs.

11. A method for accurately determining a response characteristic of a microwave device, said method comprising:
    connecting a microwave resonator to said device;
    energizing and de-energizing said resonator by a switch connected controlled cessation of energy input to said resonator without disconnection of said device from the resonator; and
    monitoring the decay of microwave energy passing from the resonator to the device after said cessation of energy input occurs.

12. Apparatus for determining a response characteristic of a microwave device, said apparatus comprising:
    a microwave resonator;
    means for coupling said microwave resonator to said device;
    means for supplying said resonator with microwave electromagnetic energy until a steady state condition is reached in which input power equals the power dissipated in and radiated from said resonator;

cutting off the supply of microwave electromagnetic energy to said resonator;

means for monitoring the time decay of power from said resonator; and means for determining the response characteristic of said device in dependence on the monitored time decay.

13. Apparatus as in claim 12 wherein said determining means comprises means for comparing the monitored time decay with a known characteristic of the time decay of radiation in said microwave resonator when supplied with radiation.

14. Apparatus as in claim 12 wherein said resonator comprises superconducting material and the apparatus comprises means for maintaining said microwave resonator at a temperature below its superconducting transition temperature.

15. Apparatus as in claim 13 wherein said resonator comprises superconducting material and the apparatus comprises means for maintaining said microwave resonator at a temperature below its superconducting transition temperature.

16. Apparatus as in claim 14 wherein the superconducting material has a transition temperature above 60K.

17. Apparatus as in claim 15 wherein the superconducting material has a transition temperature above 60K.

18. Apparatus as in claim 14 further comprising a closed cycle refrigerator for holding said microwave resonator at a temperature below its superconducting transition temperature.

19. Apparatus as in claim 15 further comprising a closed cycle refrigerator for holding said microwave resonator at a temperature below its superconducting transition temperature.

20. Apparatus as in claim 12 wherein said microwave resonator comprises dielectric material.

21. Apparatus as in claim 12 including a microwave source for supplying said microwave resonator with microwave radiation.

22. Apparatus as in claim 12 including an amplifier, coupled to said resonator, for amplifying power in said resonator.

23. A method for accurately determining a response characteristic of a microwave device, said method comprising:

(a) generating and supplying microwave energy from a microwave energy source to said microwave device;

(b) cutting off the further generation of said microwave energy; and (c) thereafter monitoring the time rate of decay for continued flow of previously stored microwave energy from said source to said microwave device to determine a response characteristic of the microwave device;

wherein the accuracy with which the stored energy decays without being connected to said device provides a reference time scale against which the determined characteristic may be accurately calibrated.

24. A method as in claim 23 wherein said microwave energy source includes a super-conducting microwave resonator.

25. A method as in claim 24 wherein said resonator is fed microwave energy from an external open-loop source.

26. A method as in claim 24 wherein said resonator is connected to form part of a closed loop microwave oscillator.

27. A method as in claim 24 wherein said resonator stays constantly connected in circuit with said device during all of steps (a), (b) and (c).

28. Apparatus for accurately determining a response characteristic of a microwave device, said apparatus comprising:

(a) means for generating and supplying microwave energy from a microwave energy source to said microwave device;

(b) means for cutting off the further generation of said microwave energy; and (c) means for thereafter monitoring the time rate of decay for continued flow of previously stored microwave energy from said source to said microwave device to determine a response characteristic of the microwave device;

wherein the accuracy with which the stored energy decays without being connected to said device provides a reference time scale against which the determined characteristic may be accurately calibrated.

29. Apparatus as in claim 28 wherein said microwave energy source includes a superconducting microwave resonator.

30. Apparatus as in claim 29 wherein said resonator is in open loop connection to an external microwave source.

31. Apparatus as in claim 29 wherein said resonator is connected to form part of a closed loop microwave oscillator.

32. Apparatus as in claim 29 wherein said resonator is constantly connected in circuit with said device while the time rate of decay is being monitored.

* * * * *